(12) United States Patent  
Soma

(10) Patent No.: US 8,693,268 B2  
(45) Date of Patent: Apr. 8, 2014

(54) SEMICONDUCTOR DEVICE

(75) Inventor: Yoshitaka Soma, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/438,742

(22) Filed: Apr. 3, 2012

(65) Prior Publication Data

US 2012/0188823 A1    Jul. 26, 2012

Related U.S. Application Data

(63) Continuation of application No. 12/801,857, filed on Jun. 29, 2010, now Pat. No. 8,179,734.

(30) Foreign Application Priority Data

Jul. 2, 2009  (JP) ................................. 2009-157696

(51) Int. Cl.  
*G11C 7/00*    (2006.01)

(52) U.S. Cl.  
USPC .................. 365/189.11; 365/189.09; 365/226

(58) Field of Classification Search  
USPC .................. 365/185.18, 189.11, 233, 189.09, 365/185.29, 195, 196, 185.23, 226, 149  
See application file for complete search history.

(56) References Cited

U.S. PATENT DOCUMENTS

| 5,267,201 | A | 11/1993 | Foss et al. |
| 6,166,960 | A | 12/2000 | Marneweck et al. |
| 6,373,326 | B1 | 4/2002 | Tomari |
| 7,187,600 | B2 | 3/2007 | Sibigtroth et al. |
| 7,251,162 | B2 | 7/2007 | Kawajiri et al. |
| 8,179,734 | B2 * | 5/2012 | Soma ............................ 365/201 |
| 2002/0031032 | A1 * | 3/2002 | Ooishi ........................ 365/226 |

FOREIGN PATENT DOCUMENTS

| JP | 2000-353392 A | 12/2000 |
| JP | 2001-155491 A | 6/2001 |

OTHER PUBLICATIONS

Japanese Office Action dated Feb. 4, 2013 with a partial English translation thereof.

* cited by examiner

*Primary Examiner* — Son Dinh  
*Assistant Examiner* — Nam Nguyen  
(74) *Attorney, Agent, or Firm* — McGinn Intellectual Property Law Group, PLLC

(57) ABSTRACT

A semiconductor device includes a charge pump circuit that generates a first voltage during a first period and a second voltage during a second period following the first period by a boosting operation, a load current application circuit that includes a first memory cell, and that applies the first voltage to the first memory cell, a memory circuit that includes a second memory cell, and that applies the second voltage to the second memory cell; and a voltage detection circuit that monitors a value of the first voltage to determine whether or not the first voltage is increased to the predetermined voltage, wherein the charge pump circuit stops the boosting operation if the first voltage is less than the predetermined voltage at an end of the first period.

4 Claims, 8 Drawing Sheets

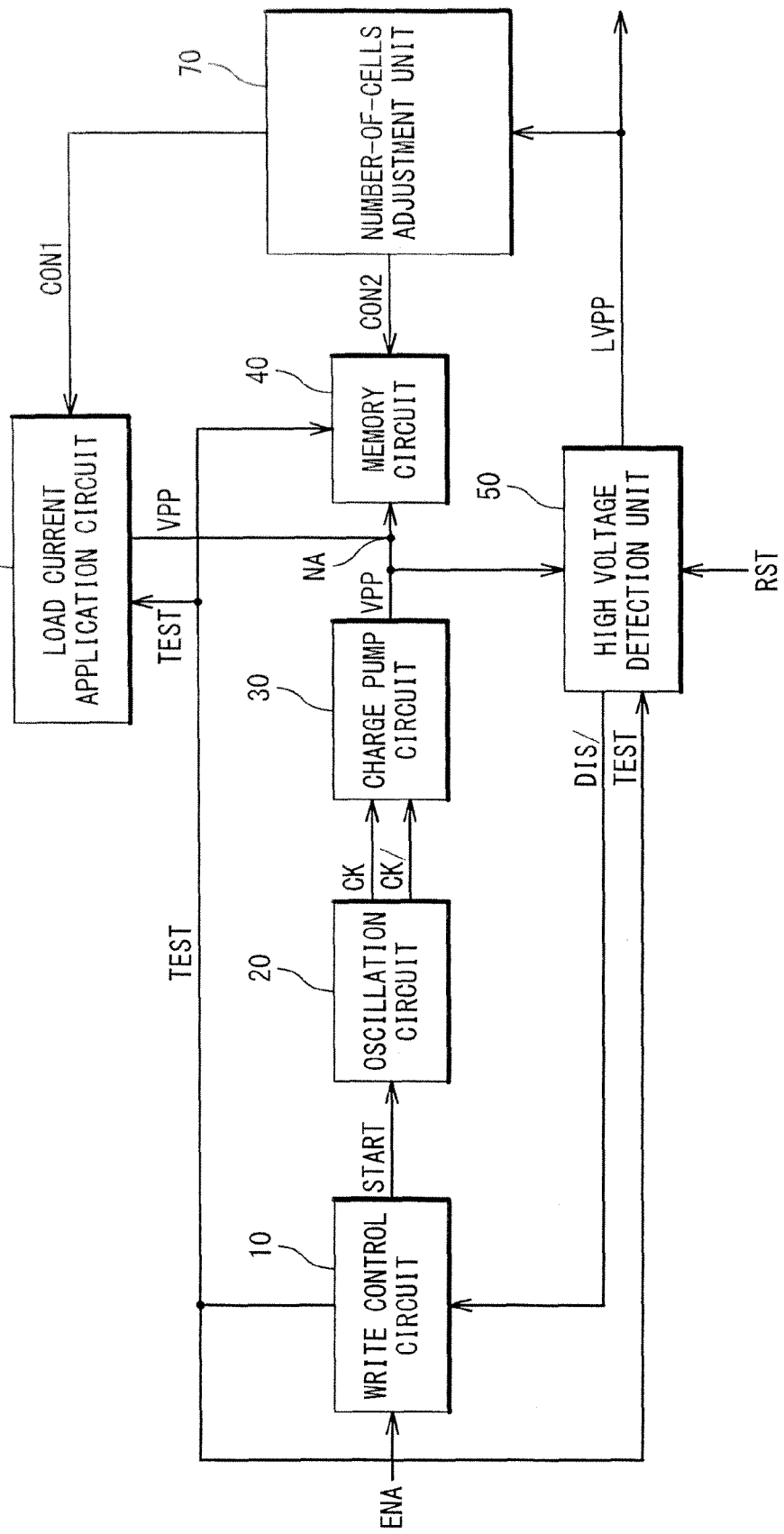

SEMICONDUCTOR DEVICE

INCORPORATION BY REFERENCE

The present application is a Continuation Application of U.S. patent application Ser. No. 12/801,857, filed on Jun. 29, 2010 now U.S. Pat. No. 8,179,734, which is based on Japanese patent application No. 2009-157696, filed on Jul. 2, 2009, the entire contents of which is incorporated herein by reference.

BACKGROUND OF THE INVENTION

1. Field of the Invention

The present invention relates to a semiconductor device that uses a charge pump circuit to generate a write voltage for a memory cell.

2. Description of Related Art

In a flash memory and an EEPROM (Electrically Erasable and Programmable ROM), a write voltage VPP which is higher than a power source voltage VDD is generally required for data writing. There is known a semiconductor device which generates such a high write voltage VPP by using a charge pump circuit. However, if boosting by the charge pump circuit is insufficient, a desired write voltage VPP is not obtained, which may cause a data write error.

U.S. Pat. No. 7,187,600 discloses a technique that generates the write voltage VPP from the power source voltage VDD by using a charge pump circuit and performs data programming/erasing for a nonvolatile memory by using the write voltage VPP. At this time, a low voltage detection circuit checks the power source voltage VDD itself that is input to a chip. If the power source voltage VDD is less than a predetermined value, a control resistor disables the charge pump circuit.

Japanese Patent Publication JP-2000-353392A discloses a technique that monitors a charge pump output (write voltage VPP) in order to suppress a data write error. FIG. 1 shows a configuration of a semiconductor device disclosed in Japanese Patent Publication JP-2000-353392A.

At a time of data writing, a write start signal ENA is activated. In response to that, a write control circuit 10 activates an oscillation instructing signal START. In response to the oscillation instructing signal START, an oscillation circuit 20 generates clock signals CK and CK/ and output the clock signals CK and CK/ to a charge pump circuit 30. The charge pump circuit 30 operates based on the clock signals CK and CK/ to generate the write voltage VPP. A memory circuit 40 uses the write voltage VPP to write a data to a memory cell.

Here, a high voltage detection unit 50 monitors whether or not the write voltage VPP is increased to a desired voltage value. More specifically, the write control circuit 10 outputs a period setting signal TEST of one pulse along with activating the oscillation instructing signal START. The period setting signal TEST is used for setting a test period during which the write voltage VPP is monitored. During the test period when the period setting signal TEST is at the High level, a switch in the memory circuit 40 cuts off supply of the write voltage VPP to a memory cell, while the high voltage detection unit 50 compares the write voltage VPP with a predetermined reference voltage.

In a case where the write voltage VPP at a time of the end of the test period does not reach the predetermined reference voltage, the high voltage detection unit 50 outputs a determination signal LVPP indicating an error and also outputs a disable signal DIS/ for stopping the boosting operation to the write control circuit 10. If the disable signal DIS/ is activated, the write control circuit 10 deactivates the oscillation instructing signal START, and thereby the oscillation circuit 20 and the charge pump circuit 30 stop operating.

As described above, if the write voltage VPP does not reach the predetermined value at the time of the end of the test period, the determination signal LVPP indicating an error is output to the outside. Furthermore, the operation of the charge pump circuit 30 is stopped and thereby the write voltage VPP is decreased. Therefore, even if the write voltage VPP is applied to the memory cell, it does not affect data stored in the memory cell. That is, uncertain data writing and erroneous data rewriting can be prevented.

SUMMARY

The inventor of the present application has recognized the following points. In the case of the configuration shown in FIG. 1, the supply of the write voltage VPP to the memory cell is cut off during the test period. That is, the output level of the charge pump is monitored under a condition that electrical connection to the memory cell is "Open". However, at a time of actual data writing, a load current flows in the memory cell. When the load current becomes more than a certain level, the output level of the charge pump is decreased. Therefore, even if a desired write voltage VPP is obtained during the test period, the desired write voltage VPP may not be obtained at the time of actual data writing. This causes a data write error.

In one embodiment of the present invention, a semiconductor device has a charge pump circuit, a load current application circuit, a memory circuit and a high voltage detection unit. The charge pump circuit, whose output is connected to a first node, starts a boosting operation after start of a test period. The load current application circuit is configured to supply a load current to the first node during the test period and to stop supply of the load current to the first node after end of the test period. A voltage of the first node is a write voltage. The memory circuit has a memory cell and is configured to stop application of the write voltage to the memory cell during the test period and to apply the write voltage to the memory cell after end of the test period. The high voltage detection unit is configured to make a comparison between the write voltage and a predetermined voltage to determine whether or not the write voltage is increased to the predetermined voltage. If the write voltage is less than the predetermined voltage at the end of the test period, the high voltage detection unit activates a disable signal. The charge pump circuit stops the boosting operation if the disable signal is activated, and otherwise the charge pump circuit continues the boosting operation.

According to the present invention, the write voltage VPP is monitored under a loaded state closer to that at the time of actual data writing. Therefore, such a problem that a desired write voltage VPP is not obtained at the time of actual data writing can be resolved. As a result, a data write error can be prevented and thus reliability is improved.

BRIEF DESCRIPTION OF THE DRAWINGS

The above and other objects, advantages and features of the p nt invention will be more apparent from the following description of certain preferred embodiments taken in conjunction with the accompanying drawings, in which:

FIG. 10 is a block diagram showing a modification example of the semiconductor device according to the present embodiment.

DESCRIPTION OF PREFERRED EMBODIMENTS

The invention will be now described herein with reference to illustrative embodiments. Those skilled in the art will recognize that many alternative embodiments can he accomplished using the teachings of the present invention and that the invention is not limited to the embodiments illustrated for explanatory purposed.

1. Configuration

Figure 2:
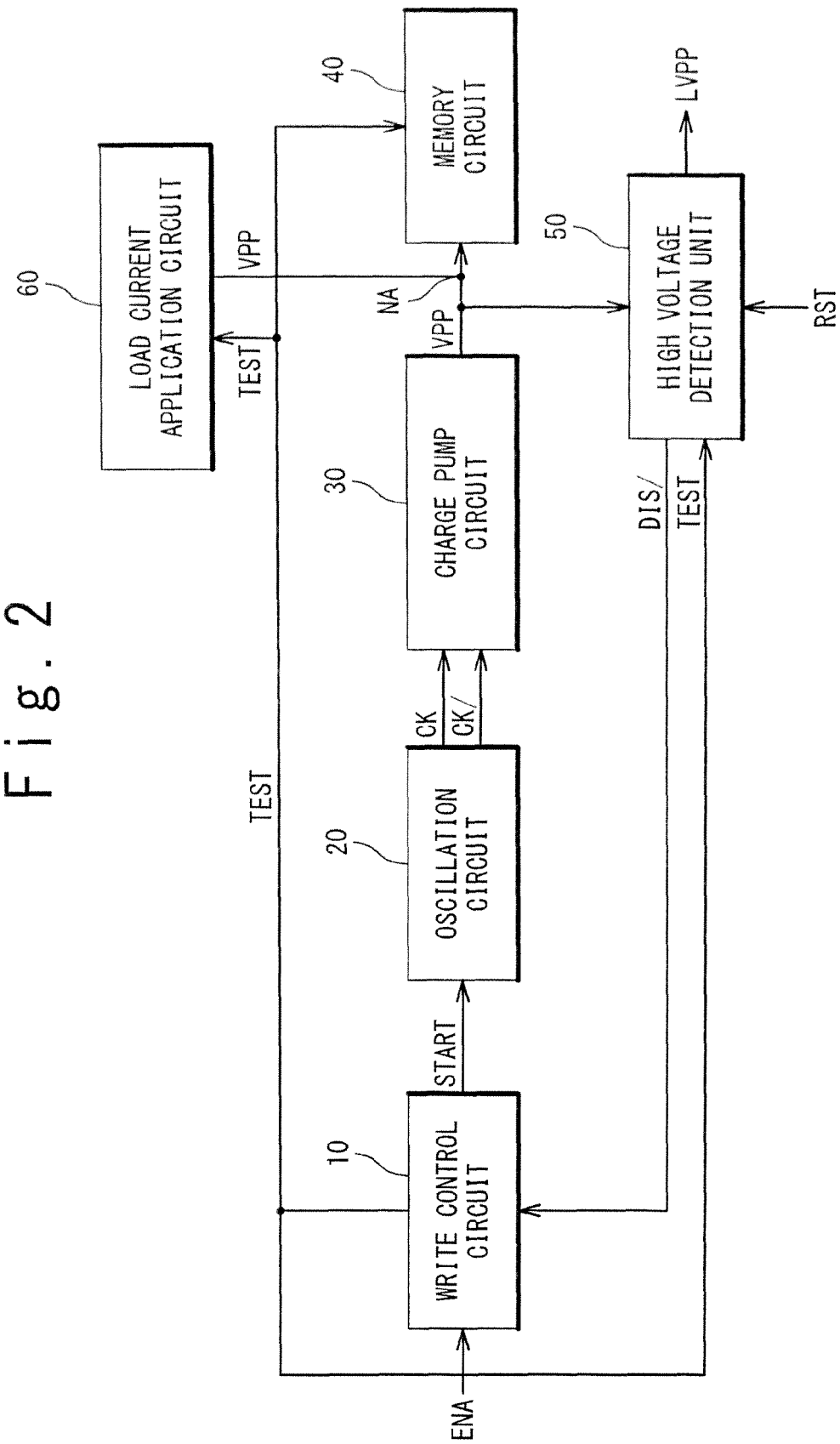
FIG. 2 is a block diagram showing a configuration of a semiconductor device according to an embodiment of the present invention.

FIG. 2 is a block diagram showing a configuration of a semiconductor device according to the present embodiment. The semiconductor device is provide with a write control circuit 10, an oscillation circuit 20, a charge pump circuit 30, a memory circuit 40, a high voltage detection unit 50 and a load current application circuit 60.

(Write Control Circuit 10)

The write control circuit 10 receives a write start signal ENA and a disable signal DIS/, and outputs an oscillation instructing signal START and a period setting signal TEST. The write start signal ENA is a signal that instructs to start data writing. The disable signal DIS/ is a signal for stopping a boosting operation by the charge pump circuit 30 which will be described later. The oscillation instructing signal START is a signal that causes the oscillation circuit 20 to perform an oscillation operation. The period setting signal TEST is a signal for setting a test period during which a write voltage VPP is monitored.

When the write start signal ENA is activated, the write control circuit 10 activates the oscillation instructing signal START and further outputs the period setting signal TEST of one pulse. Meanwhile, when the disable signal DIS/ is activated, the write control circuit 10 deactivates the oscillation instructing signal START.

Figure 3:
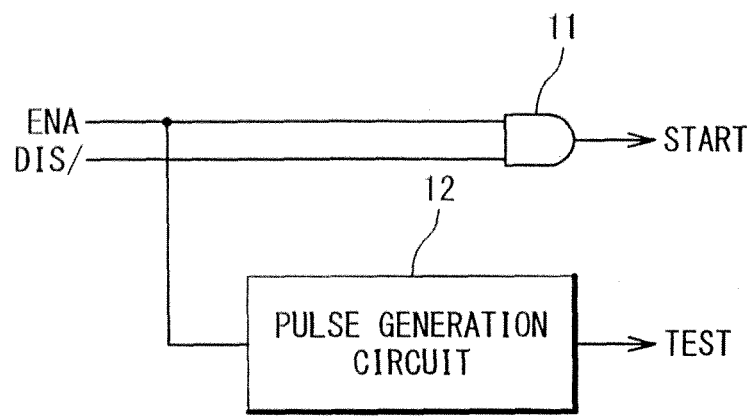
FIG. 3 is a circuit block diagram schematically showing a configuration example of a write control circuit.

FIG. 3 schematically shows a configuration example of the control circuit 10. As shown in FIG. 3, the write control circuit 10 includes an AND gate 11 and a pulse generation circuit 12. The write start signal ENA and the disable signal DIS/ are input to the AND gate 11, and logical product of those signals is output as the oscillation instructing signal START. That is, hen the write start signal ENA becomes the High level (activated) during the disable signal DIS/ is at the High level (deactivated), the oscillation instructing signal START becomes the High level (activated). When the disable signal DIS/ becomes the Low level (activated), the oscillation instructing signal START becomes the Low level (deactivated).

The pulse generation circuit 12 generates a one-shot pulse, when the write start signal ENA is brought into the High level. This pulse serves as the period setting signal TEST. The period setting signal TEST is maintained at the High level for a predetermined period (e.g. 200 microseconds). The predetermined period corresponds to the test period for monitoring the write voltage VPP.

(Oscillation Circuit 20)

The oscillation circuit 20 is connected to an output of the write control circuit 10 and receives the oscillation instructing signal START from the write control circuit 10. When the oscillation instructing signal START is at the High level (activated), the oscillation circuit 20 performs an oscillation operation to generate a clock signal CK (e.g. 5 MHz) and a clock signal CK/ with the opposite phase. The oscillation circuit 20 supplies the clock signals CK and CK/ to the charge pump circuit 30. When the oscillation instructing signal START is at the Low level (deactivated), the oscillation circuit 20 stops the oscillation operation.

(Charge Pump Circuit 30)

The charge pump circuit 30 receives the clock signals CK and CK/ from he oscillation circuit 20 and performs a boosting operation based on the clock signals CK and CK/. More specifically, the charge pump circuit 30 boosts the power source voltage VDD by using the clock signals CK and CK/ to generate a high voltage. An output of the charge pump circuit 30 is connected to a "node NA", and the high voltage generated by the charge pump circuit 30 is output to the node NA.

(Memory Circuit 40)

The memory circuit 40 is provided with a memory cell and has a function of storing a data in the memory cell. For example, the memory circuit 40 is a nonvolatile memory such as a flash memory and an EEPROM. The memory circuit 40 is connected to the above-mentioned node NA and uses a voltage of the node NA for data writing to the memory cell. That is, the voltage of the node NA is the "write voltage VPP". In the case of the flash memory and the EEPROM, the write voltage VPP required for the data writing is, for example, 15V or more.

In the present embodiment, the memory circuit 40 receives the above-mentioned period setting signal TEST from the write control circuit 10. When the period setting signal TEST is at the High level, namely during the test period, the memory circuit 40 stops application of the write voltage VPP to the memory cell. Accordingly, the data writing to the memory cell is not carried out during the test period. On the other hand, when the period setting signal TEST is at the Low level, namely after the test period is ended, the memory circuit 40 applies the write voltage VPP to the memory cell.

Figure 4:
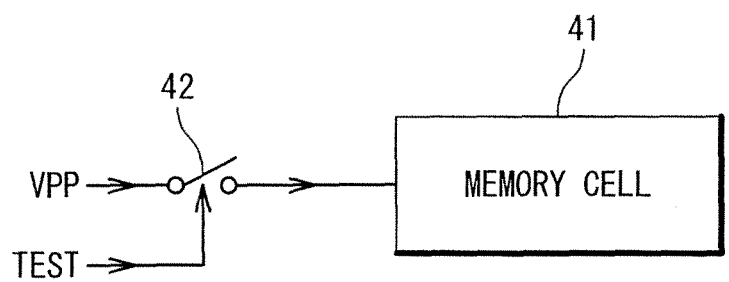
FIG. 4 is a circuit block diagram schematically showing a configuration example of a memory circuit.

FIG. 4 schematically shows a configuration example of the memory circuit 40. The memory circuit 40 has a memory cell 41 and a switch 42. The switch 42 turns ON/OFF electrical connection between the node NA and the memory cell 41, depending on the period setting signal TEST. When the period setting signal TEST is at the High level, namely during the test period, the switch 42 is turned OFF. Accordingly, supply of the write voltage VPP to the memory cell 41 is cut off. On the other hand, when the period setting signal TEST is at the Low level, namely after the test period is ended, the switch 42 is turned ON. As a result, the write voltage VPP is supplied to the memory cell 41.

(High Voltage Detection Unit 50)

The high voltage detection unit 50 is connected to the above-mentioned node NA and monitors the write voltage VPP that appears at the node NA. More specifically, the high voltage detection unit 50 makes a comparison between the write voltage VPP and a predetermined voltage to determine whether or not the write voltage VPP has reached the predetermined voltage. In other words, the high voltage detection unit 50 determines whether or not the write voltage VPP is increased to the predetermined voltage. Moreover, the high voltage detection unit 50 receives the above-mentioned period setting signal TEST from the write control circuit 10 and outputs the above-mentioned disable signal DIS/ to the write control circuit 10. If the write voltage VPP is less than the predetermined voltage at the time of the end of the test period, the high voltage detection unit 50 sets the above-mentioned disable signal DIS/ to the Low level (activated) and thereby stops the boosting operation of the charge pump circuit 30. Furthermore, the high voltage detection unit 50 outputs a determination signal LVPP which indicates an error.

Figure 5:
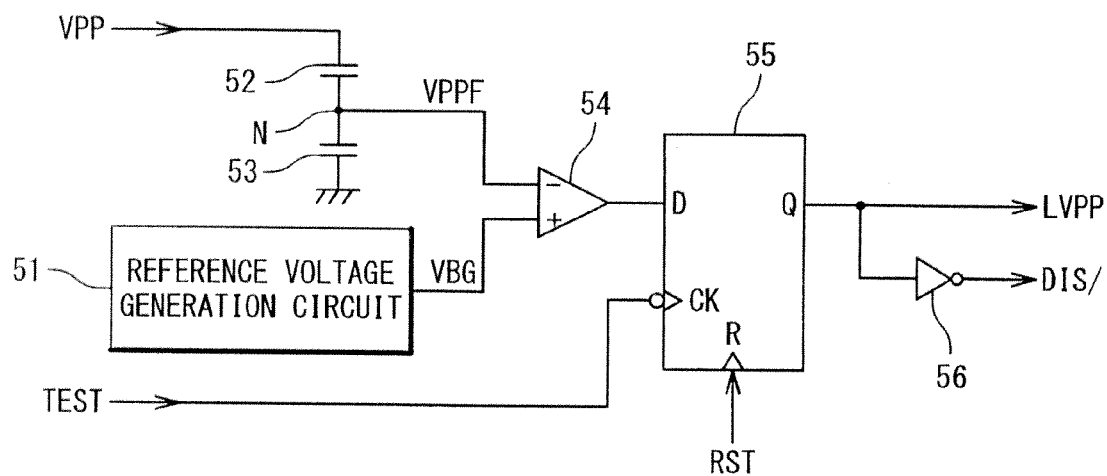
FIG. 5 is a circuit block diagram schematically showing a configuration example of a high voltage detection unit.

FIG. 5 schematically shows a configuration example of the high voltage detection unit 50. As shown in FIG. 5, the high voltage detection unit 50 includes a reference voltage generation circuit 51, capacitors 52 and 53, a comparison circuit 54, a flip flop 55 and an inverter 56.

The reference voltage generation circuit 51, which is for example a hand gap reference voltage generating source, generates a reference voltage VBG. The capacitors 52 and 53 are series-connected between the above-mentioned node NA and the ground to voltage-divide the write voltage VPP. As a result of the voltage division, a voltage VPPF depending on the write voltage VPP appears at a connection node N between the capacitors 52 and 53.

The comparison circuit 54 makes a comparison between the reference voltage VBG and the voltage VPPF. More specifically, an inverted input terminal (−) of the comparison circuit 54 is connected the above-mentioned connection node N, and a non-inverted input terminal (+) of the comparison circuit 54 is connected to an output terminal of the reference voltage generation circuit 51. If the voltage VPPF depending on the write voltage VPP is higher than the reference voltage VBG, the comparison circuit 54 outputs a Low level signal. On the other hand, if the voltage VPPF depending on the write voltage VPP is lower than the reference voltage VBG, the comparison circuit 54 outputs a High level signal.

A reset signal RST is externally input to a reset terminal (R) of the flip flop 55. The output signal from the comparison circuit 54 is input to a data input terminal (D) of the flip flop 55. The period setting signal TEST from the write control circuit 10 is input to a clock signal terminal (CK) of the flip flop 55. The determination signal LVPP is output from an output terminal (Q) of the flip flop 55. Also, the output terminal (Q) flip flop 55 is connected to an inverter 63, and an inverted signal of the determination signal LVPP serves as the disable signal DIS/.

The flip flop 55 thus configured latches, in synchronization with a falling edge of the period setting signal TEST at the end of the test period, the output signal from the comparison circuit 54 and outputs it as the determination signal LVPP. In the case where the voltage VPPF depending on the write voltage VPP is higher than the reference voltage VBG, the comparison circuit 54 outputs the Low level signal. In this case, the determination signal LVPP becomes the Low level indicating a normal state, and the disable signal DIS/ becomes the High level (deactivated). On the other hand, in the case where the voltage VPPF depending on the write voltage VPP is lower than the reference voltage VBG, the comparison circuit 54 outputs the High level signal. In this case, the determination signal LVPP becomes the High level indicating an error, and the disable signal DIS/ becomes the Low level (activated).

(Load Current Application Circuit 60)

The load current application circuit 60 is connected to the above-mentioned node NA and supplies a "load current" to the node NA. More specifically, the load current application circuit 60 receives the above-mentioned period setting signal TEST from the write control circuit 10. When the period setting signal TEST is at the High level, namely during the test period, the load current application circuit 60 supplies the load current to the node NA. The load current is equivalent to a current flowing in the memory cell 41 of the memory circuit 40 at the time of data writing. That is to say, even during the test period, the node NA is set to a condition closer to that at the time of the actual data writing. On the other hand, when the period setting signal TEST is at the Low level, namely after the test period is ended, the load current application circuit 60 stops the supply of the load current to the node NA.

Figure 6:
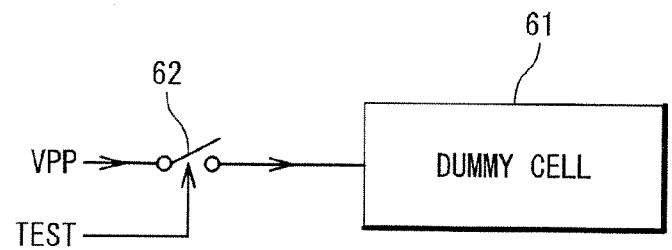
FIG. 6 is a circuit block diagram schematically showing a configuration example of a load current application circuit.

FIG. 6 schematically shows a configuration example of the load current application circuit 60. The load current application circuit 60 is provided with a dummy cell 61 and a switch 62. The dummy cell 61 has a same structure as that of the memory cell 41 of the memory circuit 40. The switch 62 turns ON/OFF electrical connection between the node NA and the dummy cell 61, depending on the period setting signal TEST. When the period setting signal TEST is at the High level, namely during the test period, the switch 62 is turned ON. In this case, the write voltage VPP of the node NA is applied to the dummy cell 61, and consequently the load current equivalent to the current flowing in the memory cell 41 is supplied to the node NA. On the other hand, when the period setting signal TEST is at the Low level, namely after the end of the test period, the switch 62 is turned OFF. In this case, the supply of the write voltage VPP to the dummy cell 61 is cut off, and thus the load current is not supplied to the node NA.

2. Operation 2-1. Operation in Error State

Figure 7:
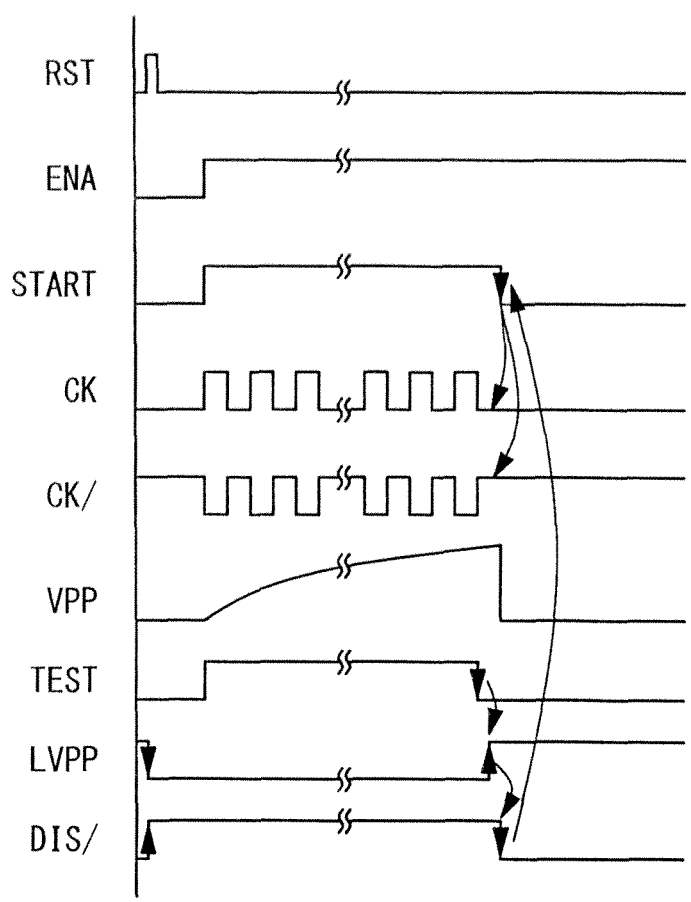
FIG. 7 is a timing chart for explaining an example of an operation of the semiconductor device according to the present embodiment.

FIG. 7 shows a timing chart in a case where the write voltage VPP is insufficient. When the reset signal RST is externally input, the flip flop 55 is reset. As a result, the determination signal LVPP becomes the Low level and the disable signal DIS/ becomes the High level, irrespective of the state before. After that, the write start signal ENA becomes the High level and hence the oscillation instructing signal START becomes the High level. At the same time, the period setting signal TEST with a pulse width of 200 microseconds is output from the write control circuit 10 and thus the test period is started.

In response to the oscillation instructing signal START, the oscillation circuit 20 generates the clock signals CK and CK/. The charge pump circuit 30 performs the boosting operation based on the clock signals CK and CK/. As a result, the write voltage VPP at the node NA is gradually increased. At this time, the electrical connection between the node NA and the memory cell 41 of the memory circuit 40 is cut off. Instead, the load current application circuit 60 supplies the load current equivalent to the current of the memory cell 41 to the node NA. Consequently, the charge pump circuit 30 can carry out the boosting operation under a loaded state at the time of the actual data writing.

When the test period is ended, the period setting signal TEST falls from the High level to the Low level. In response to the falling, the flip flop 55 latches the output signal of the comparison circuit 54 and outputs it as the determination signal LVPP. In the present example, the write voltage VPP does not reach the predetermined voltage at the time of the end of the test period. In this case, the High level signal is being output from the comparison circuit 54 and thus the determination signal LVPP is changed to the High level that indicates an error. Also, the disable signal DIS/ is changed from the High level to the Low level (activated). As a result, the oscillation instructing signal START is changed to the Low level and thus the oscillation circuit 20 stops the oscillation operation. Accordingly, the charge pump circuit 30 also stops the boosting operation.

In this manner, if the write voltage VPP does not reach the predetermined value at the time of the end of the test period, the determination signal LVPP indicating the error is externally notified. Furthermore, the operation of the charge pump circuit 30 is stopped and thereby the write voltage VPP is decreased. Therefore, even if the write voltage VPP is applied to the memory cell 41, it does not affect data stored in the memory cell 41. That is, uncertain data writing and erroneous data rewriting can be prevented.

Furthermore, during the test period, even though the electrical connection between the node NA and the memory cell 41 is cut off, the load current equivalent to the current of the memory cell 41 is supplied to the node NA. Consequently, the charge pump circuit 30 can carry out the boosting operation under a loaded state at the time of the actual data writing. Therefore, the high voltage detection unit 50 also can monitor the write voltage VPP under the loaded state closer to that at the time of the actual data writing. Accordingly, determination accuracy is improved, and such a problem that a desired write voltage VPP is not obtained at the time of the actual data writing can be resolved. As a result, a data write error can be prevented and thus reliability is improved.

2-2. Operation in Normal State

Figure 8:
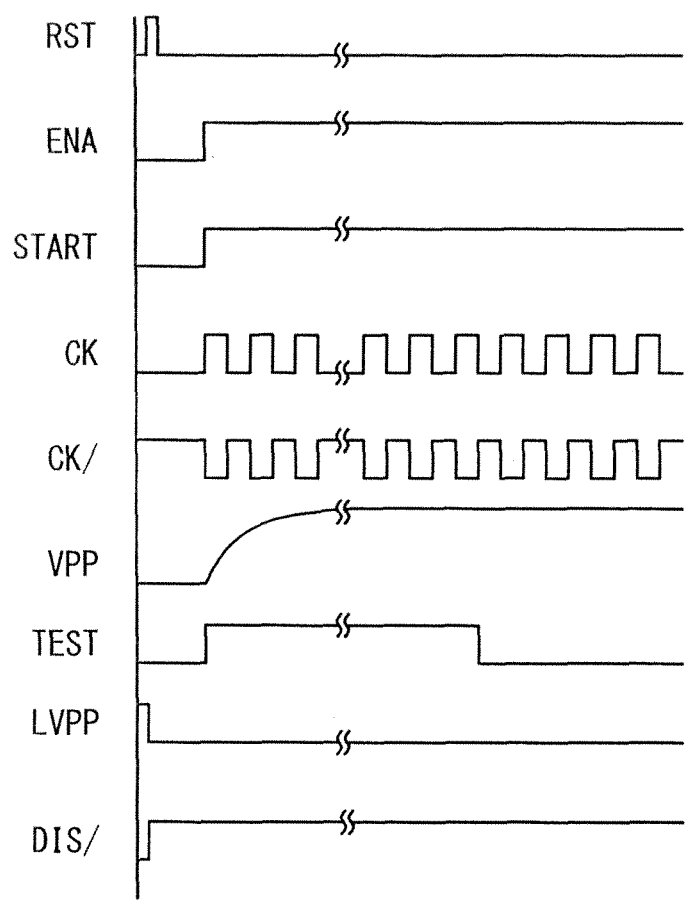
FIG. 8 is a timing chart for explaining another example of an operation of the semiconductor device according to the present embodiment.

FIG. 8 shows a timing chart in a case where a sufficient write voltage VPP is obtained. The operation until the end of the test period is the same as in the case shown in FIG. 7. When the test period is ended, the period setting signal TEST falls from the High level to the Low level. In response to the falling, the flip flop 55 latches the output signal of the comparison circuit 54 and outputs it as the determination signal LVPP. In the present example, the write voltage VPP has reached the predetermined voltage at the time of the end of the test period. In this case, the Low level signal is being output from the comparison circuit 54 and thus the determination signal LVPP is maintained at Low level. Therefore, the disable signal DIS/ is maintained at the High level, the oscillation circuit 20 continues the oscillation operation, and the charge pump circuit 30 continues the boosting operation. After that, the memory circuit 40 applies the write voltage VPP having the sufficient magnitude to the memory cell 41, and thereby the data writing is carried out normally.

3. Effects

Figure 1:
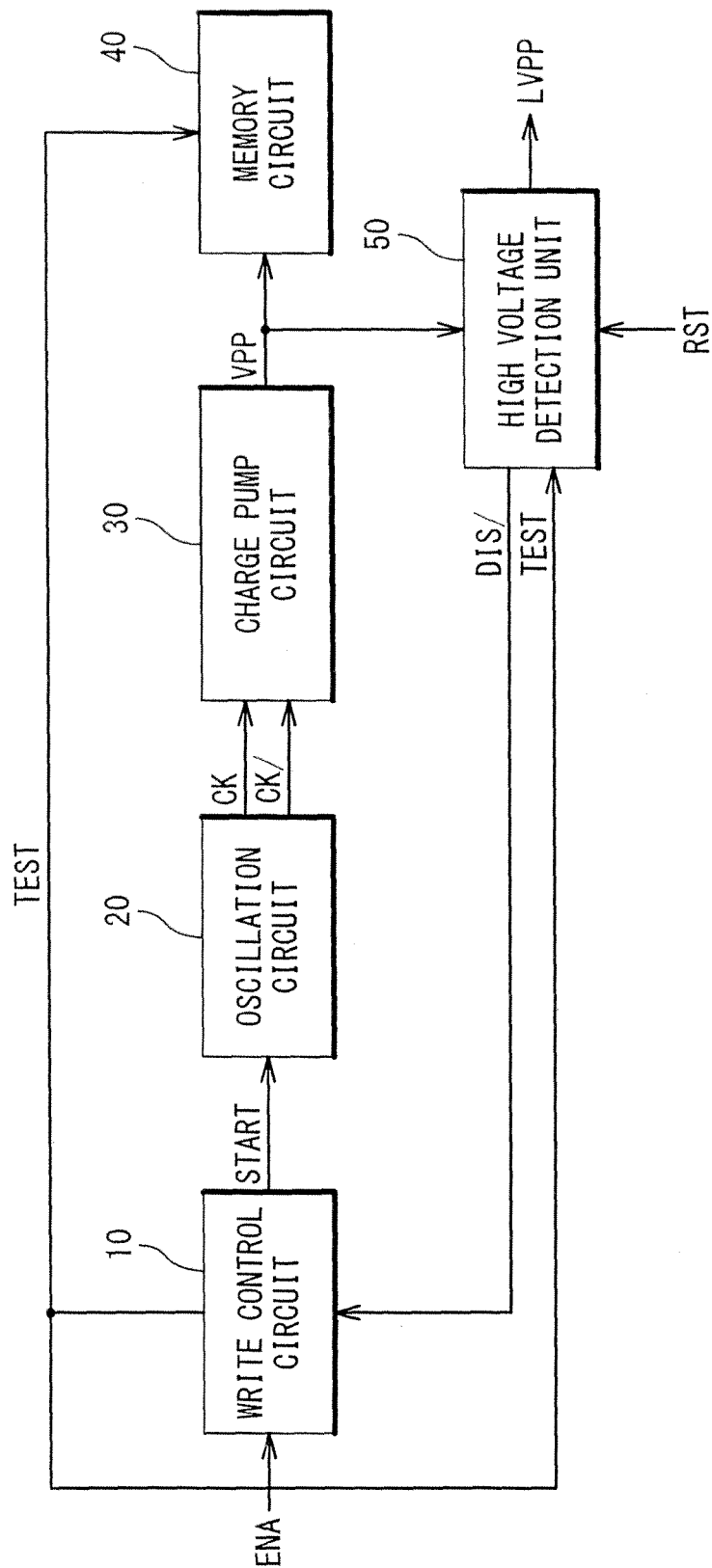
FIG. 1 is a block diagram showing a configuration of a conventional semiconductor device.
Figure 9:
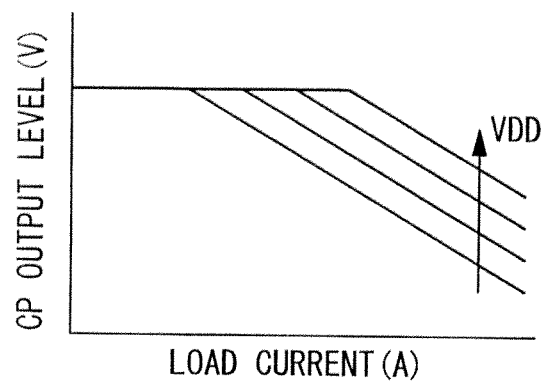
FIG. 9 is a conceptual diagram for explaining effects of the present embodiment.

In the case of the configuration shown in FIG. 1, the supply of the write voltage VPP to the memory cell is cut off during the test period. That is, the output level of the charge pump is monitored under a condition that electrical connection to the memory cell is "Open". However, at a time of actual data writing, a load current flows in the memory cell. As shown in FIG. 9, when the load current becomes more than a certain level, the output level of the charge pump is decreased. Therefore, even if a desired write voltage VPP is obtained during the test period, the desired write voltage VPP may not be obtained at the time of actual data writing. This causes a data write error According to the present embodiment, during the test period, even though the electrical connection between the node NA and the memory cell 41 is cut off, the load current equivalent to the current of the memory cell 41 is supplied to the node NA. Consequently, the charge pump circuit 30 can carry out the boosting operation under a loaded state at the time of the actual data writing. Therefore, the high voltage detection unit 50 also can monitor the write voltage VPP under the loaded state closer to that at the time of the actual data writing. Accordingly, determination accuracy is improved, and such a problem that a desired write voltage VPP is not obtained at the time of the actual data writing can he resolved. As a result, a data write error can be prevented and thus reliability is improved.

4. Modification Example

FIG. 10 shows a modification example of the semiconductor device according to the present embodiment. In the present modification example, the semiconductor device is further provided with a number-of-cells adjustment unit 70 in addition to the configuration shown in FIG. 2. The number-of-cells adjustment unit 70 outputs a control signal CON1 to the load current application circuit 60 and outputs a control signal CON2 to the memory circuit 40.

The control signal CON1 specifies the number of the dummy cells 61 to which the write voltage VPP is simultaneously applied during the test period. The load current application circuit 60 generates the load current by applying the write voltage VPP simultaneously to the dummy cells 61 whose number is specified by the control signal CON1. By changing the number of the dummy cells 61 by using the control signal CON1, the magnitude of the load current can be changed. That is, the load current application circuit 60 variably sets the magnitude of the load current by variably setting the number of the dummy cells 61 to which the write voltage VPP is applied during the test period.

The control signal CON2 specifies the number of the memory cells 41 to which the write voltage VPP is simultaneously applied at the time of data writing. The memory circuit 40 applies the write voltage VPP simultaneously to the memory cells 41 whose number is specified by the control signal CON2. Here, the number of the memory cells 41 is set to be the same as the number of the dummy cells 61 to which the write voltage VPP has been applied during the test period. That is, the memory circuit 40 applies the write voltage VPP to the memory cells 41 whose number is the same as the above-described number of the dummy cells 61.

For example, the number-of-cells adjustment unit 70 receives the determination signal LVPP from the high voltage detection unit 50. In a case where the determination signal LVPP is at the Low level, the number-of-cells adjustment unit 70 increases the number of the dummy cells 61 specified by the control signal CON1 and the number of the memory cells 41 specified by the control signal CON2. On the other hand, in a case where the determination signal LVPP is at the High level, the number-of-cells adjustment unit 70 decreases the number of the dummy cells 61 specified by the control signal CON1 and the number of the memory cells 41 specified by the control signal CON2. Accordingly, it is possible to increase the number of simultaneous write cells within a range where the write voltage VPP required for the data writing can be obtained.

It is apparent that the present invention is not limited to the above embodiments and may be modified and changed without departing from the scope and spirit of the invention.

What is claimed is:

1. A semiconductor device comprising:
a charge pump circuit that generates a first voltage during a first period and a second voltage during a second period following the first period by a boosting operation;
a load current application circuit that includes a first memory cell, and that applies the first voltage to the first memory cell;
a memory circuit that includes a second memory cell, and that applies the second voltage to the second memory cell; and
a voltage detection circuit that monitors a value of the first voltage to determine whether or not the first voltage is increased to the predetermined voltage,
wherein the charge pump circuit stops the boosting operation when the first voltage is less than the predetermined voltage at an end of the first period;
a control circuit that generates a mode signal, the signal being activated during the first period and being deactivated during the second period;
a first switch circuit that is coupled between a node of the charge pump circuit and the first memory cell, and that operates in response to the mode signal; and
a second switch circuit that is coupled between the node of the charge pump circuit and the second memory cell, and that operates in response to the mode signal.

2. A semiconductor device comprising:
a charge pump circuit that generates a first voltage during a first period and a second voltage during a second period following the first period by a boosting operation;
a load current application circuit that includes a first memory cell, and that applies the first voltage to the first memory cell;
a memory circuit that includes a second memory cell, and that applies the second voltage to the second memory cell; and
a voltage detection circuit that monitors a value of the first voltage to determine whether or not the first voltage is increased to the predetermined voltage,
wherein the charge pump circuit stops the boosting operation when the first voltage is less than the predetermined voltage at an end of the first period,
wherein the load current application circuit comprises a plurality of memory cells,
wherein the memory circuit comprises a plurality of memory cells,
wherein the semiconductor device further comprises:
a number-of-cells adjustment circuit that generates a first adjustment signal indicative of a number of the memory cells of the load current application circuit to which the first voltage should be applied, and a second adjustment signal indicative of a number of the memory cells of the memory circuit to which the second voltage should be applied,
wherein the load current application circuit applies the first voltage to any of the memory cells of the load current application circuit in response to the first adjustment signal, and
wherein the memory circuit applies the second voltage to any of the memory cells of the memory circuit in response to the second adjustment signal.

3. The semiconductor device according to claim 2,
wherein the number of the memory cells of the load current application circuit to which the first voltage should be applied is a same as the number of the memory cells of the memory circuit to which the second voltage should be applied.

4. The semiconductor device according to claim 2,
wherein a number-of-cells adjustment circuit generates the first and second adjustment signals based on a monitoring result by the voltage detection circuit.

* * * * *